(12) United States Patent
Saito et al.

(10) Patent No.: US 7,591,641 B2
(45) Date of Patent: Sep. 22, 2009

(54) MOLD AND PROCESS OF PRODUCTION THEREOF

(75) Inventors: Tatsuya Saito, Ebina (JP); Aya Imada, Yokohama (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 316 days.

(21) Appl. No.: 11/367,343

(22) Filed: Mar. 6, 2006

(65) Prior Publication Data

US 2006/0216413 A1  Sep. 28, 2006

(30) Foreign Application Priority Data

Mar. 22, 2005 (JP) .............................. 2005-080923

(51) Int. Cl.
*B29C 59/00* (2006.01)
*B28B 7/38* (2006.01)

(52) U.S. Cl. ...................... 425/385; 427/133

(58) Field of Classification Search ................ 425/385; 249/134; 264/293; 427/133
See application file for complete search history.

(56) References Cited

U.S. PATENT DOCUMENTS 6,024,907 A * 2/2000 Jagunich ..................... 264/284
6,139,713 A  10/2000 Masuda et al.
6,866,730 B2 * 3/2005 Cheng et al. ................. 148/516
2004/0247732 A1 * 12/2004 Walk .......................... 425/385

FOREIGN PATENT DOCUMENTS

JP   10-121292 A    5/1998
JP   2004-285422 A   10/2004

OTHER PUBLICATIONS

Stephen Y. Chou et al., "Imprint of Sub-25 nm Vias and Trenches in Polymers," 67(21) Appl. Phys. Lett. 3114-16 (Nov. 1995).

* cited by examiner

*Primary Examiner*—Maria Veronica D Ewald
(74) *Attorney, Agent, or Firm*—Fitzpatrick, Cella, Harper & Scinto

(57) ABSTRACT

A novel mold is provided. The mold is prepared through steps of forming a concavo-convex pattern on a substrate, forming a film by embedding a material of a composition having shape-memory in the concavo-convex pattern, and forming a mold having the concavo-convex pattern by separating the film from the concavo-convex pattern after the film formation in the film formation step.

7 Claims, 3 Drawing Sheets

MOLD AND PROCESS OF PRODUCTION THEREOF

BACKGROUND OF THE INVENTION

1. Field of the Invention

The present invention relates to a mold, and a process for production of the mold. The present invention relates also to a member having a concavo-convex pattern prepared by use of the mold.

2. Related Background Art

A typical technique for transferring a pattern onto a substrate employed in semiconductor processes is a light exposure technique. In conventional light exposure techniques, integrated circuits of semiconductors have been made finer with a remarkable improvement in the resolution by a fine processing technique for light exposure with a shorter wavelength light source and with the progress in the area of the optical systems. At the moment, exposure of an extremely fine pattern of 100 nm or finer can be conducted by an ArF excimer laser ($\lambda$=193 nm). For finer pattern, an $F_2$ excimer laser ($\lambda$=157 nm), EUV (extreme UV), X-rays, and electron beams are investigated as the next-generation exposure techniques.

However, the above exposure techniques have the disadvantages of requiring an expensive exposure apparatus, having a low throughput, and the like.

In recent years, a novel microfabrication technique, called a nano-imprinting method, has attracted attention as a microfabrication technique for attaining a high resolution at a low cost. The nano-imprinting method is described, for example, by S. Y. Chou et al.: Appl. Phys. Lett. 67, 3114 (1995) (non-patented document 1). By this technique, a mold having a projection-depression pattern (hereinafter referred to as an concavo-convex pattern) of a nano scale is pressed against a resin layer like a resist on a substrate to transfer the pattern entirely onto the resist, the mold is separated, and a process of etching and lift-off is conducted to form a resist pattern on the substrate. The concavo-convex pattern of the mold is formed by a conventional process by use of an electron beam exposure method or the like. This novel microfabrication technique is simple and productive and is low in production cost due to the repeated use of the mold.

The nano-imprinting method is also applicable in the formation of initiation points in anodization of aluminum. An example is described in Japanese Patent Application Laid-Open No. H10-121292 (patent document 1). In this method, a mold having a regular projection-depression pattern is pressed against a surface of an aluminum substrate to transfer the projections of the mold onto the aluminum substrate as depressions to form physically the initiation points for the anodization, and the aluminum is anodized to form a highly regular porous film. This method enables formation of a fine pattern having an extremely high aspect ratio, or the like, which cannot be formed by a conventional exposure technique. Therefore, this method is useful in many application fields, such as production of magnetic recording media and the like. As described above, the nano-imprinting technique can be superior to conventional exposure techniques. However, even with this technique, for advanced miniaturization of the working pattern, the mold production becomes more difficult. Conventionally, a mold is prepared through steps of applying a resist on a substrate of Si or the like as the base of the mold; forming a resist pattern by exposure to electron beams, X-rays, or the like to form a resist pattern; and transferring the resist pattern to the substrate by selective etching or lift-off. However, the selective dry etching or lift-off becomes more difficult due to the finer exposure pattern, and the exposed pattern is liable not to be transferred precisely onto the substrate, causing a deterioration of the pattern.

To overcome the above disadvantages, Japanese Patent Application Laid-Open No. 2004-285422 (patent document 2), for example, discloses a technique of preparation of a mold, comprising steps of forming an electroconductive metal film directly on a resist pattern; depositing a metal by plating; and removing the resist. This technique is explained by reference to FIGS. 3A, 3B, 3C and 3D. Firstly, resist layer 31 on substrate 30 is patterned by forming fine unevens by a conventional exposure process, such as electron beam lithography and X-ray lithography (FIG. 3A).

Then, on the fine concavo-convex pattern on resist layer 31, layer 32 of an electroconductive metal for electroplating or a catalyst for electroless plating is formed by vacuum deposition, glow discharge, ion-beam sputtering, or a like process (FIG. 3B).

Then, on layer 32 of the electroconductive metal or the catalyst, metal 33 (e.g., nickel) for the mold is deposited by plating (FIG. 3C).

Further, from metal 33 deposited on the surface of the resist, resist layer 31 is removed to obtain mold 34 (FIG. 3D).

By the method of Patent Document 2, a mold is prepared through the above steps.

SUMMARY OF THE INVENTION

The method of the above Patent Document 2 enables formation of a metal mold having a finer concavo-convex pattern than that prepared by the method of Patent Document 1. However, the process of the mold preparation includes a metal-plating step, requiring formation of an electrode, such as an electroconductive layer or a catalyst layer, on the resist. This makes the mold preparation process complicated. Further, dissolution of the resist by the plating solution and other problems should be taken into account.

Nano-imprinting mold, which is used repeatedly, becomes warped or bent during the repeated use. The above Patent Document 2 mentions no countermeasure against such deformation.

The present invention is intended to provide a mold for nano-imprinting having fine projections-and-depressions (hereinafter referred to as unevens), the mold being prepared by a simple process with high reproducibility, and being capable of coping with warping and bending caused by repeated use. The present invention is also intended to provide a process for preparation of the above mold.

According to an aspect of the present invention, there is provided a mold for nano-imprinting with a concavo-convex pattern comprising a surface portion, wherein the surface portion has the concavo-convex pattern and comprises a shape-memory material.

The surface portion is preferably prepared by a process comprised of the steps:

forming a film of the shape-memory material on an article having an concavo-convex pattern, and separating the film from the article. The formed film preferably has a small thickness. Alternatively, a thick film is preferably formed on the formed film.

The shape-memory material is preferably an NiTi alloy. The NiTi alloy is preferably composed of Ni and Ti at a composition ratio of 52:48 (atom %).

According to another aspect of the present invention, there is provided a process for preparing a mold for nano-imprinting, comprising steps of: forming a concavo-convex pattern on a substrate, forming a film of a shape-memory material on the concavo-convex pattern by making an impression of the concavo-convex pattern with the shape-memory material, and separating the film from the concavo-convex pattern to obtain a mold having the transferred concavo-convex pattern.

The film is preferably formed on the concavo-convex pattern by any of sputtering, CVD and vapor deposition of the shape-memory material in the film-forming step.

The film is preferably given the shape of a thin film on the concavo-convex pattern in the film-forming step. The separating step is preferably comprised of bonding an adhesive tape to the thin film to separate the film from the concavo-convex pattern.

The film-forming step is preferably comprised of a step of forming a thick film on the film formed on the concavo-convex pattern. The separating step is preferably comprised of a step of holding the thick film by a holding means to separate the film from the concavo-convex pattern. Alternatively, the thick film-forming step is preferably comprised of Ni plating on the film formed on the concavo-convex pattern using an NiTi alloy.

According to a still another aspect of the present invention, there is provided a mold having a surface portion comprising a concavo-convex pattern, which surface portion is comprised of a shape-memory material.

According to a further aspect of the present invention, there is provided a method for transferring a concavo-convex pattern, which comprises the steps of:

preparing a substrate having a transfer layer, and transferring a concavo-convex pattern which the above mold has to the transfer layer.

According to a further aspect of the present invention, there is provided a method for fabricating a member having a concave portion, which comprises the steps of:

preparing a member having a transfer layer on the surface thereof, transferring a concavo-convex pattern which the above mold has to the transfer layer, and forming a concave portion in the member, using the transfer layer as a mask. The member is exemplified by a silicon substrate, a quartz substrate, a GaN substrate, a substrate having an amorphous silicon layer or a polycrystalline silicon layer, and a glass substrate.

The transfer layer comprises a thermoset or thermoplastic resin, or a light-curing resin, which is set using UV light or the like.

The shape-memory material is an NiTi alloy. The NiTi alloy is preferably composed of Ni and Ti at a composition ratio of 52:48 (atom %).

The thick film-forming step is preferably comprised of Ni plating on a Cu film formed by sputtering on the film formed on the concavo-convex pattern using an NiTi alloy.

In the description below, molds for nano-imprinting are explained as examples, but the mold of the present invention is not limited to the mold for nano-imprinting.

To solve the aforementioned problems, the present invention provides a mold for nano-imprinting having a constitution described below, and provides also a process for preparing the mold.

The mold of the present invention for nano-imprinting is characterized in that at least a surface portion having the concavo-convex pattern is constituted of a shape-memory material. The surface portion may be prepared by forming a film of a shape-memorizing NiTi alloy on a base article having the concavo-convex pattern, and separating the film from the base article to obtain a mold having the concavo-convex pattern. The process for preparing the mold of the present invention comprises steps of forming a concavo-convex pattern on a substrate, forming a film of a shape-memory material by embedding in the concavo-convex pattern, and separating the formed film from the concavo-convex pattern to obtain a mold having the concavo-convex pattern transferred thereon. In the present invention, the film formation with the afore-mentioned material on the concavo-convex pattern in the film-forming step may be conducted by any of a sputtering process, a CVD process, or a vapor-deposition process.

The mold for nano-imprinting of the present invention has a fine concavo-convex pattern and is capable of coping with warping and bending caused by repeated use. The mold for nano-imprinting can be prepared with high reproducibility through a simple and precise process.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention

DETAILED DESCRIPTION OF THE INVENTION

Embodiments of the present invention are explained below specifically.

Figure 1A:
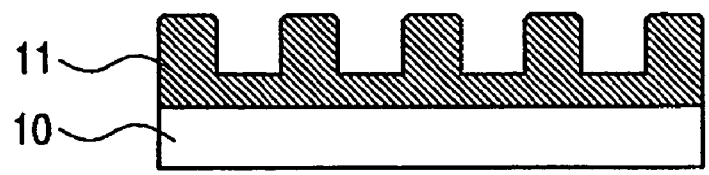
FIGS. 1A, 1B, and 1C show schematically a process for preparing a mold for nano-imprinting in an embodiment of the present invention.
Figure 1B:
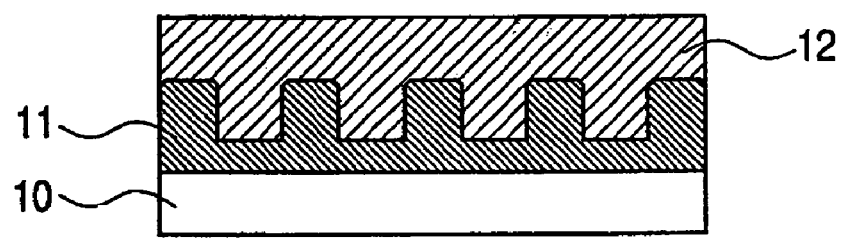
Figure 1C:
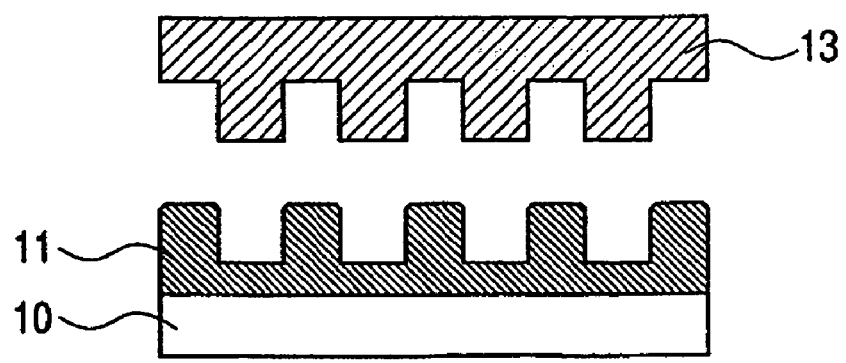

FIGS. 1A, 1B, and 1C show schematically a process for preparing a mold for nano-imprinting in an embodiment of the present invention.

The process for preparing a mold for nano-imprinting in an embodiment of the present invention is explained by reference to FIGS. 1A, 1B, and 1C.

Incidentally, as mentioned above, although the nano-imprinting molds are explained as examples, the present invention is not limited thereto and also covers molds for preparing a micron-order concavo-convex pattern.

Firstly, a concavo-convex pattern is formed on resist layer 11 applied on substrate 10 (FIG. 1A). The concavo-convex pattern may be formed by electron beam irradiation on resist layer 11, by pressing another mold having a preliminarily provided concavo-convex pattern against resist layer 11 (hereinafter referred to as "master mold"), or by a like method.

Secondly, a film of a material of a shape-memorizing composition, such as NiTi alloy film 12, is formed on the above concavo-convex patterned resist layer 11 formed thereon (FIG. 1B). The film on insulating resist layer 11 can be formed by any method, which does not require an electrode on the substrate side, the method including sputtering methods, CVD methods, vapor deposition methods, and so forth.

Next, NiTi alloy film 12 is separated from resist layer 11 (FIG. 1C) to obtain mold 13 having a pattern transferred from the resist. NiTi alloy film 12 formed at a small thickness can be readily separated by use of an adhesive tape. Otherwise, NiTi alloy film 12, which is made thicker by additional metal plating thereon, can readily be separated by use of a pincette. Although the separation can be conducted by dissolving resist layer 11, the separation by dissolution of resist layer 11 is not preferred for repeated use of the resist pattern.

In this embodiment, NiTi alloy film 12 is formed on resist layer 11 having a concavo-convex pattern thereon as mentioned above without using an electrode on the substrate surface by a method such as sputtering, CVD, and vapor deposition. The omission of electrode formation simplifies the process and eliminates the problem of depletion of the resist caused by dissolution in the plating solution.

In preparing a mold, generally, the embedding of a mold material in a concavo-convex pattern is conducted by plating. However, at a lower aspect ratio of the uneven, a satisfactory film can be formed by a process such as sputtering by keeping the distance long between the target and the substrate, by applying a bias to the substrate, or the like. When a mold having a fine concavo-convex pattern of a high aspect ratio is used, the protruding portions of the pattern can be bent or chipped undesirably on pressing the mold against a workpiece. Therefore, in the preparation of the mold in this embodiment, the material for the mold should have a sufficient mechanical strength and the aspect ratio should not be so high. With such a material, the above-mentioned sputtering can be employed in the mold preparation.

Further, in this embodiment, the NiTi alloy film can be formed uniformly on patterned resist layer 11, and exfoliation of the film from resist layer 11 can be suppressed.

This is explained below more specifically. A thin film formed on a resist cannot have a high strength of bonding to the resist. Therefore, when there is stress in the film formed on the resist, the film tends to exfoliate from resist layer 11 due to this stress during or after film formation, and a uniform film as that shown in FIG. 1B is not formed, which is undesirable. It is known that the NiTi alloy film causes tensile stress at a lower Ni composition ratio, causes no residual stress at about a Ni composition ratio of about 52 atom %, and causes compressive stress at a higher Ni composition ratio.

Therefore, the composition ratio of Ni to Ti in the NiTi alloy film to be formed on the resist is adjusted to be about 52:48 (atom %) to reduce the stress in the film to prevent exfoliation of the film from resist layer 11. The term "atom %" signifies the ratio of the atoms contained in the alloy. This ratio can be determined quantitatively, for example, by ICP (induction coupling type plasma emission analysis).

The NiTi alloy film is formed in an amorphous state. There are fewer irregularities in the surface caused by the grain boundary after film formation, resulting in an extremely flat surface with a high level of strength. Therefore, the film is the most suitable for the material for the mold.

The use of the NiTi alloy enables the mold to cope with warping and bending caused by repeated use.

The NiTi alloy, which is a shape-memory alloy, has a property that the alloy memorizes its shape after a shape-memorizing treatment of crystallization and heat-treatment at a high temperature of about 500° C. Immediately after the shape-memorizing treatment, the NiTi shape-memory alloy has an austenite phase structure. It transforms by cooling into a martensite phase structure (martensite transformation). When the NiTi alloy is deformed by an external force at a lower temperature, the alloy recovers its original shape by heating up to a temperature above the transition point called a transformation temperature of about 100° C. due to the change to an austenite phase structure (reverse transformation). The shape-recoverable deformation of the alloy is about 7-8% or less. This characteristic property is applied to microactuators or the like. Therefore, a mold formed from the alloy and having been subjected to the above shape-memorizing treatment can recover its original shape even after the mold is warped or bent by repeated use.

As described above, in this embodiment, a mold is formed directly from the NiTi alloy by use of a resist pattern. Thereby, a mold for nano-imprinting can be prepared simply and precisely and can recover the original shape even if the mold is warped or bent by repeated use. The mold can be prepared through a simple process in comparison with conventional processes including dry-etching steps and lift-off steps.

EXAMPLES

Examples of the present invention are described below.

Example 1

In this Example, a mold is prepared from an NiTi alloy by use of a resist pattern according to the present invention.

Firstly, by use of a mask formed by electron beam exposure, a 5-mm square mater mold was prepared, which had Si projections in a circular truncated cone shape that are about 80 nm high arranged at intervals of 100 nm in a triangular lattice.

Next, on another Si substrate, an electron beam resist was applied in a thickness of about 50 nm by spin coating. With this resist-coated substrate kept heated at 120° C., the above master mold was pressed against the resist layer at a pressure of 1 ton/cm$^2$.

After the substrate was cooled, the master mold was separated from the resist layer. The surface of the resist layer was examined by AFM (atomic force microscopy), and it was found that the projections of the master mold had been transferred as depressions onto the resist layer with the depression depth of about 40 nm and the depression diameter of about 60 nm.

On the resist pattern thus prepared, an NiTi alloy film was formed by sputtering with an NiTi target that was 4 inches (101.6 mm) in diameter having an NiTi composition ratio of 50:50 (atom %) under the sputtering conditions of the DC power input of 300 W, the argon gas pressure of 0.1 Pa, and the target-substrate distance of 150 nm.

The obtained NiTi alloy film was examined by ICP for the Ni/Ti constitution ratio. The ratio was found to be about 52:48 (atom %). The time for the alloy film formation was adjusted to obtain a 1 μm thick NiTi alloy film. The specimen was taken out of the sputtering apparatus after the film formation.

The formed NiTi alloy film adhered to the resist layer without exfoliation from the resist layer, and was formed to be uniform visually on the resist layer.

On the other hand, as a comparative example, Ti and W, which have a high hardness and a high melting point, were respectively formed into a film under the same conditions as above. Very frequently, the respective films partly or entirely exfoliated. Thus, a uniform Ti or W film could not be readily formed.

The formed NiTi alloy film was separated from the resist layer by bonding a double-sided adhesive tape thereto and peeling the double-sided adhesive tape together with the NiTi alloy film. The surface of the separated NiTi alloy film was examined by FE-SEM (field emission scanning electron microscopy) and AFM. Thereby, the NiTi mold (replica mold) was found to have projections that were about 40 nm high in the same pattern as the master mold without causing a defect.

Incidentally, for facilitating the handling of the mold, the above double-sided adhesive tape may be replaced by Ni at a thickness of about 50 μm formed by electrolytic plating on the NiTi alloy film. Thereby, the NiTi alloy film can be separated readily by use of a pincette. However, since the directly plated Ni layer does bond to the NiTi alloy film with a sufficient bonding strength, the NiTi alloy film is preferably coated with Cu at a thickness of about 5 nm by sputtering before the Ni plating.

After a replica mold was prepared once, the master mold was subjected to ashing to remove the resist adhering to the master mold and was again used in the same process as in the above Example. Thus, the master mold was confirmed to be useful for repeated preparation of the replica mold.

As described above, in this Example, a mold was prepared simply from an NiTi alloy with a fine resist pattern. Further, from a master mold prepared by electron beam exposure, plural replica molds of the NiTi alloy film could be simple to prepare.

Example 2

In this Example, nano-imprinting was conducted with the NiTi mold prepared in Example 1. In particular, with a nano-imprint employing the NiTi mold, aluminum was anodized to prepare highly regular porous film.

FIGS. 2A, 2B, 2C, 2D, 2E and 2F are drawings for explaining the nano-imprinting process employing the NiTi mold in this Example.

Figure 2A:
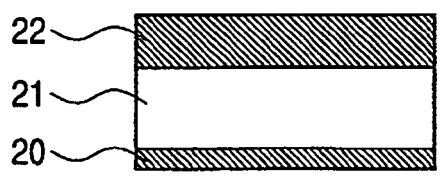
FIGS. 2A, 2B, 2C, 2D, 2E, and 2F are drawings for explaining a nano-imprinting operation by use of an NiTi mold in Example 2 of the present invention.

Firstly, on Si substrate 20, Al layer 21 is formed in a thickness of 50 nm by sputtering, and thereon, electron beam resist layer 22 was applied in a thickness of 50 nm by spin coating (FIG. 2A).

Figure 2B:
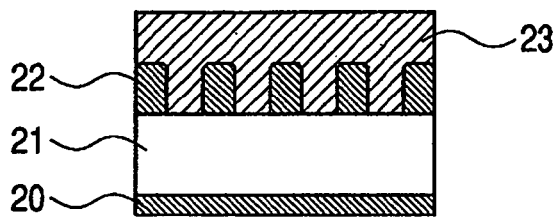

Secondly, with the substrate kept heated at 120° C., the NiTi mold 23 prepared in Example 1 was pressed against resist layer 22 at a pressure of 1 ton/cm$^2$ (FIG. 2B).

Figure 2C:
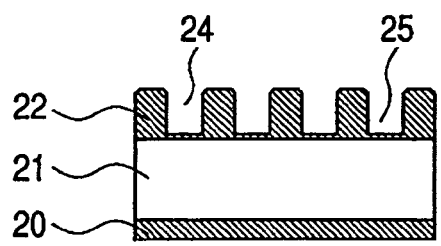

After cooling the substrate, NiTi mold 23 was separated and removed (FIG. 2C).

The surface of separated resist layer 22 was examined by AFM. It was confirmed that the projections of the NiTi mold were transferred as depressions 24 onto resist layer 22, and that the depths of depressions 24 were about 40 nm, being nearly equal to the height of the projections of the NiTi mold.

Then, the depressions 24 of resist layer 22 were transferred to Al layer 21 by dry etching in an atmosphere of a gas mixture of $BCl_3$ and $O_2$. The above gas mixture was used to etch simultaneously the resist remaining on the bottom of the depressions 24 and the surface of Al layer 21.

Figure 2D:
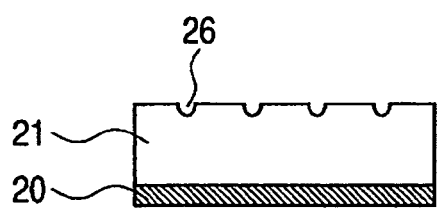

Thereafter, the resist layer was removed by ashing by use of ozone and ultraviolet light. As a result, it was confirmed that depressions 26 corresponding to the pattern of the NiTi mold were formed on the surface of Al layer 21 (FIG. 2D).

Successively, the workpiece was anodized in an aqueous 0.3 mol/L oxalic acid solution at a bath temperature of 16° C. at an applied voltage of 40V.

Figure 2E:
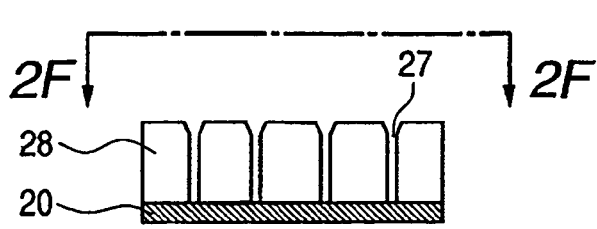
Figure 2F:
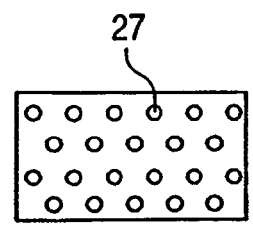
Figure 3A:
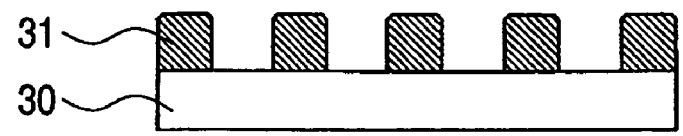
FIGS. 3A, 3B, 3C, and 3D show schematically a process for preparing a mold for nano-imprinting in a conventional process described in Patent Document 1.
Figure 3B:
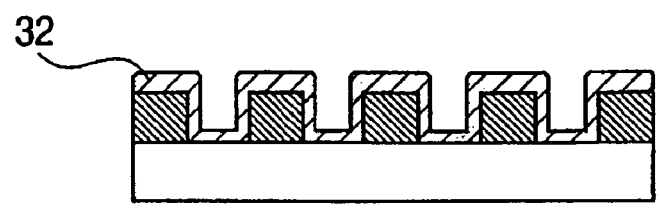
Figure 3C:
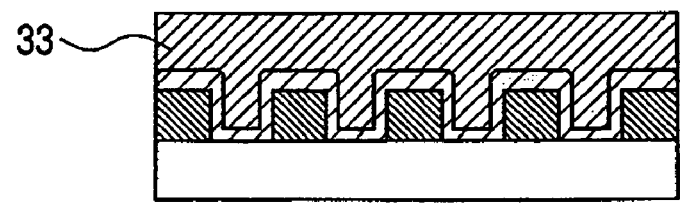
Figure 3D:
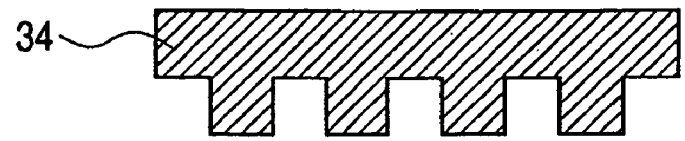

After the anodization, the surface and the cross-section of the workpiece were observed by FE-SEM. Thereby, it was found that fine pores 27 30 nm in diameter were formed in a triangular lattice arrangement at intervals of 100 nm, and that a porous film 28 was formed with fine pores 27 arranged regularly as shown in FIG. 2E, and in FIG. 2F, a plan view taken at line 2F-2F (FIGS. 2E and 2F).

As described above, in this Example, a resist pattern corresponding precisely to the pattern of the NiTi mold was formed by use of the NiTi mold prepared in Example 1. The mold prepared by the preparation process of this Example is highly useful as a mold for nano-imprinting. This is useful for anodization of aluminum to form a porous film of a regular arrangement corresponding to the mold pattern at a high level of reproducibility.

This application claims priority from Japanese Patent Application No. 2005-080923, filed on Mar. 22, 2005, which is incorporated herein by reference.

What is claimed is:

1. A mold for nano-imprinting with a concavo-convex pattern comprising a surface portion,
   wherein the surface portion has the concavo-convex pattern and comprises a shape-memory material, and
   wherein the shape-memory material is an NiTi alloy composed of Ni and Ti at a ratio of 52:48 atom %.

2. The mold for nano-imprinting according to claim 1, wherein the surface portion is prepared by a process comprising the steps of:
   forming a film of the shape-memory material on an article having a concavo-convex pattern; and
   separating the film from the article.

3. The mold for nano-imprinting according to claim 2, wherein the formed film has a small thickness.

4. The mold for nano-imprinting according to claim 2, wherein a thick film is formed on the formed film.

5. A mold having a surface portion comprising a concavo-convex pattern,
   wherein the surface portion comprises a shape-memory material, and
   wherein the shape-memory material is an NiTi alloy composed of Ni and Ti at a ratio of 52:48 atom %.

6. A method for transferring a concavo-convex pattern, which comprises the steps of:
   preparing a substrate having a transfer layer; and
   transferring the concavo-convex pattern from the mold according to claim 5 to the transfer layer.

7. A method for fabricating a member having a concave portion, which comprises the steps of:
   preparing a member having a transfer layer on its surface,
   transferring a concavo-convex pattern from the mold according to claim 5 to the transfer layer; and
   forming the concave portion in the member using the transfer layer as a mask.

* * * * *